United States Patent
Ahn et al.

(10) Patent No.: US 6,573,547 B2
(45) Date of Patent: Jun. 3, 2003

(54) METHOD FOR FORMING CELL CAPACITOR FOR HIGH-INTEGRATED DRAMS

(75) Inventors: Byoung-kwon Ahn, Seoul (KR); Sung-hun Park, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/020,649

(22) Filed: Dec. 12, 2001

(65) Prior Publication Data

US 2002/0094624 A1 Jul. 18, 2002

(30) Foreign Application Priority Data

Dec. 29, 2000 (KR) ................................. 2000-0086403

(51) Int. Cl.⁷ .................... H01L 27/108; H01L 21/8242
(52) U.S. Cl. .................. 257/296; 257/310; 438/240; 438/253; 438/798
(58) Field of Search .................. 438/239, 240, 438/253, 795, 798; 257/296, 306, 310

(56) References Cited

U.S. PATENT DOCUMENTS

| | | | | |
|---|---|---|---|---|
| 5,250,456 A | * | 10/1993 | Bryant | 438/253 |
| 6,037,205 A | * | 3/2000 | Huh et al. | 438/240 |
| 6,096,597 A | * | 8/2000 | Tsu et al. | 438/240 |
| 6,171,899 B1 | * | 1/2001 | Liou et al. | 438/240 |
| 2001/0011740 A1 | * | 8/2001 | Deboer et al. | 257/306 |

* cited by examiner

*Primary Examiner*—Tuan N. Quach
(74) *Attorney, Agent, or Firm*—Marshall, Gerstein & Borun

(57) ABSTRACT

A method for forming a cell capacitor used for a high-integrated DRAM is disclosed which guarantees interfacial properties of aluminum oxide and excellent leakage current preventive properties by depositing an aluminum oxide layer and a mixed layer of TiON and TiO$_2$ as dielectric layers on a semiconductor substrate having a predetermined lower substructure by an atomic layer deposition (ALD) method and thus forming a double layer structure, and simultaneously providing a high capacitance by using a high dielectric property of a mixed layer of TiON and TiO$_2$.

14 Claims, 2 Drawing Sheets

METHOD FOR FORMING CELL CAPACITOR FOR HIGH-INTEGRATED DRAMS

BACKGROUND

1. Technical Field

A method is disclosed for forming a cell capacitor for a high-integrated DRAM which provides good interfacial properties of aluminum oxide and excellent leakage current preventive properties by depositing an aluminum oxide layer and a mixed layer of TiON and $TiO_2$ as dielectric layers on a semiconductor substrate having a predetermined lower substructure by an atomic layer deposition (ALD) method and thus forming a double layer structure, and simultaneously providing a high capacitance by using a high dielectric property of a mixed layer of TiON and $TiO_2$.

2. Description of the Related Art

Recently, with the development of semiconductor integrated circuit processing techniques, the minimum line width of a device manufactured on a semiconductor substrate is decreasing and unit area integration degree is increasing. Meanwhile, as the integration degree of a memory cell increases, a space occupied by a cell capacitor for charge storage becomes smaller. Thus, it is necessary to develop a cell capacitor having an increased unit area capacitance.

Generally, a capacitor is used for storing charge and supplying charge as needed for the operation of a semiconductor substrate. As the semiconductor becomes more highly integrated, the size of a unit cell becomes smaller and the capacitance required for the operation of the device increases.

The structure of a charge storage electrode of the capacitor is divided broadly into a stacked structure for acquiring a large capacitor area by stacking multi-layers on a narrow planar area and a trench structure for storing charge by forming a trench of a predetermined depth on a semiconductor substrate and then forming a capacitor on that portion.

Particularly, efforts for increasing the charging capacitance of the capacitor are made by constructing the stacked structure as a deformed capacitor structure such as HSG (hemispherical shaped grains), bellows, etc. which are formed by deforming a fin type, a cylinder type and a cavity type.

In a conventional art, with the high integration of semiconductor devices, capacitors also are required to be miniaturized. However, there is a limitation on storing charge, so there occurs a difficulty in highly integrating the capacitor as compared with the size of a cell.

Therefore, to solve the above problem, a material with a high dielectric constant such as TiON is used for increasing the charge of the capacitor, however, use of materials with a high dielectric constant leads to a high leakage current in performing the subsequent process.

In contrast, when aluminum oxide is used for guaranteeing a low leakage current, interfacial properties and leakage current properties are excellent, but capacitance is low.

SUMMARY OF THE DISCLOSURE

A method for forming a cell capacitor for a high-integrated DRAM is disclosed which provides good interfacial properties of aluminum oxide and excellent leakage current preventive properties by depositing an aluminum oxide layer and a mixed layer of TiON and $TiO_2$ as dielectric layers on a semiconductor substrate having a predetermined lower substructure by an atomic layer deposition (ALD) method and thus forming a double layer structure, and simultaneously provides a high capacitance by using a high dielectric property of a mixed layer of TiON and $TiO_2$.

A method for forming a cell capacitor for a high-integrated DRAM in accordance with the disclosure comprises: depositing a first dielectric layer on a semiconductor substrate having a predetermined lower structure; performing an annealing process under nitrogen atmosphere again after performing a plasma annealing process on the resultant material; performing a low temperature annealing and a furnace vacuum annealing processes after depositing a second dielectric layer on the resultant material; and depositing sequentially a titanium nitride layer and a poly silicon layer on the resultant material.

BRIEF DESCRIPTION OF THE DRAWINGS

The above, features and advantages of the disclosed methodology will become more apparent from the following detailed description taken in conjunction with the accompanying drawings, wherein.

DETAILED DESCRIPTION OF THE PRESENTLY PREFERRED EMBODIMENTS

Preferred embodiments will now be described with reference to the accompanying drawings.

FIGS. 1a through 1d are cross-sectional views sequentially illustrating a method for forming a cell capacitor used for a high-integrated DRAM in accordance with the disclosed methods.

Figure 1A:
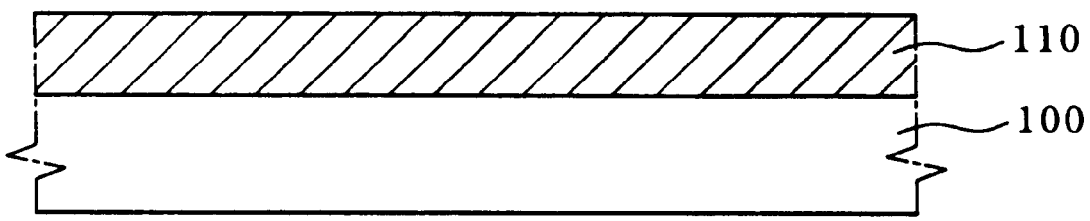
FIGS. 1a through 1d are cross-sectional views sequentially illustrating a method for forming a cell capacitor for a high-integrated DRAM in accordance with the present invention.

As illustrated in FIG. 1a, aluminum oxide is deposited as a first dielectric layer 110 on a semiconductor substrate 100 having a predetermined lower substructure by an ALD (atomic layer deposition) method.

At this time, the first dielectric layer 110 is deposited on the semiconductor substrate 100 heated at a temperature ranging from about 200 to about 450° C. in a chamber having a pressure ranging from about 0.1 to about 1 Torr by using vapor.

Figure 1B:
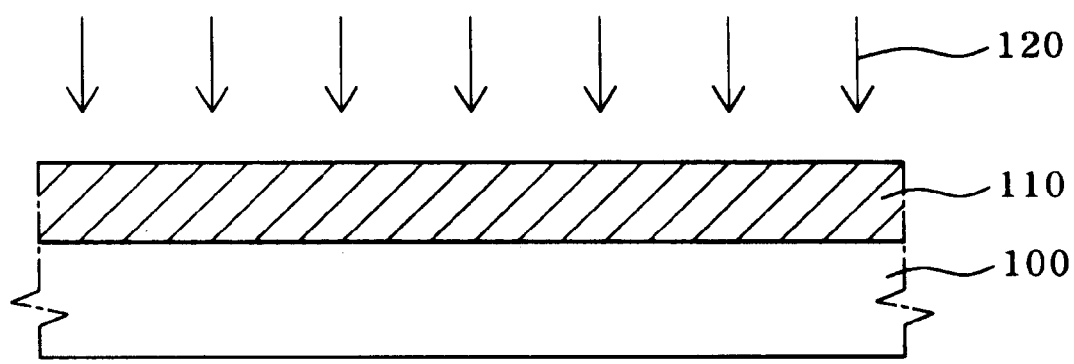

Then, as illustrated in FIG. 1b, carbon and impurities in the aluminum oxide are removed by performing a $N_2O$ plasma annealing process 120 on the resultant material at a temperature ranging from about 300 to about 400° C., and then the aluminum oxide layer (the first dielectric layer 110) is crystallized by performing an annealing process under nitrogen atmosphere a time period ranging from about 10 to about 30 minutes at a temperature ranging from about 600 to about 650° C.

Figure 1C:
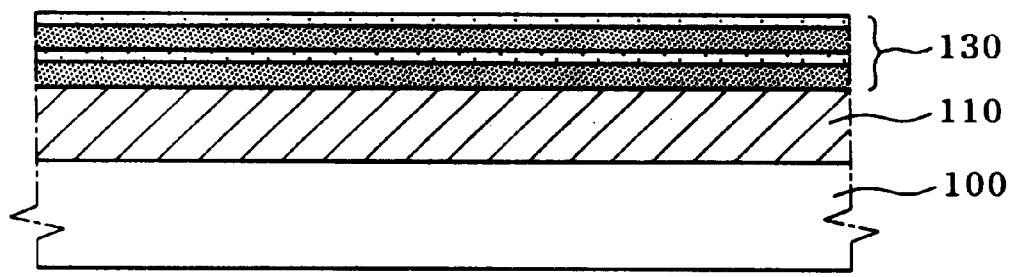

Continuously, as illustrated in FIG. 1c, a mixture of TiON(A) and $TiO_2$(B) is deposited on the resultant material as a second dielectric layer 130 by using the ALD (atomic layer deposition) method, and then low temperature anneal and furnace vacuum anneal processes are performed.

At this time, as the second dielectric layer 130, a TaON layer(A) is deposited on the semiconductor substrate heated at a temperature ranging from about 250 to about 350° C. to a thickness of below about 10 Å by the ALD (atomic layer deposition) method. To prevent residue of each material from being remained, inert gas such as $N_2$, Ar, He, etc. is injected between the injection of Ta(OC$_2$H$_5$)$_5$ source gas and the injection of reactive material NH$_3$ gas.

In addition, in the ALD (Atomic Layer Deposition) method, when the injection of Ta(OC$_2$H$_5$)$_5$ source gas, the injection of inert gas such as N$_2$, Ar, He, etc. and the injection of NH$_3$ gas are achieved in one cycle, the thickness of the TaON layer(A) deposited per cycle ranges from about 0.1 to about 1 Å, thus enabling the deposition of a layer with a thickness ranging from about 0.1 to about 10 Å.

Then, a TiO$_2$ layer(B) is deposited to a thickness of below 5 Å by the ALD (Atomic Layer Deposition). To prevent residue of each material from being remained, inert gas such as N$_2$, Ar, He, etc. is injected between the injection of Ta(OC$_2$H$_5$)$_5$ source gas and the injection of reactive material NH$_3$ gas.

At this time, in the ALD (atomic layer deposition) method, when the injection of TiCl$_4$ source gas, the injection of inert gas such as N$_2$, Ar, He, etc. and the injection of at least one of H$_2$O, O$_2$ and N$_2$O gases are achieved in one cycle, the thickness of the TaON layer(A) deposited per cycle ranges from about 0.1 to about 1 Å, thus enabling the deposition of a layer with a thickness ranging from about 0.1 to about 5 Å.

At this time, the injection time of each gas ranges from about 0.1 to about 10 sec.

In addition, by controlling the cycle so that the deposition ratio of the TaON layer(A) and the TiO$_2$ layer(B) is (90~92):(8~10), the TaON layer(A) and the TiO$_2$ layer are alternately deposited to a thickness ranging from about 100 to about 200 Å.

Moreover, the TaON layer(A) and the TiO$_2$(B) layer alternately deposited are converted into a single mixed layer by a low temperature annealing at a temperature ranging from about 400 to about 550° C. In the furnace vacuum annealing process, impurities in the second dielectric layer 130 are removed and crystallized by performing the annealing for a time period ranging from about 5 to about 60 minutes at a temperature ranging from about 600 to about 850° C.

Figure 1D:
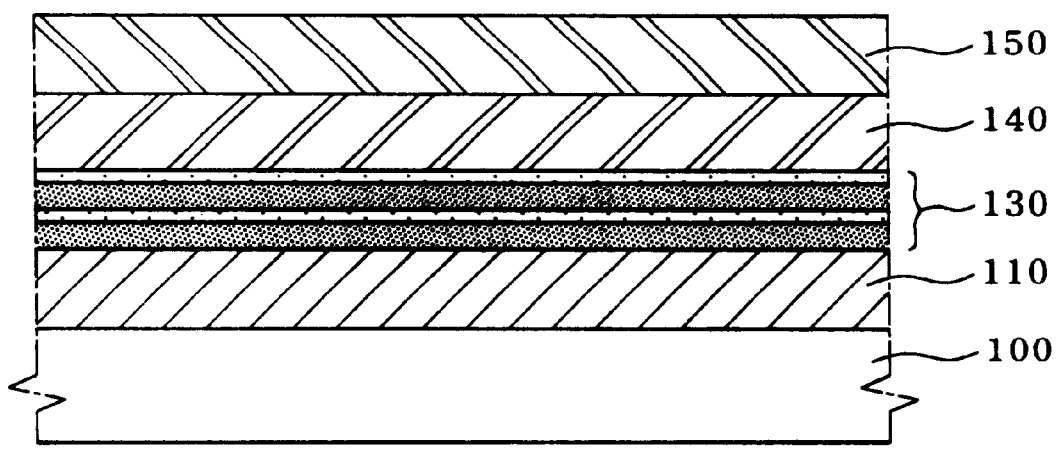

Continuously, as illustrated in FIG. 1d, a titanium nitride layer 140 is deposited on the resultant material as an upper electrode to a thickness ranging from about 200 to about 500 Å, and then a polysilicon layer 150 is sequentially deposited to a thickness ranging from about 900 to about 1100 Å.

Accordingly, in the disclosed method for forming a cell capacitor used for a high-integrated DRAM, interfacial properties of aluminum oxide and excellent leakage current preventive properties are guaranteed by depositing an aluminum oxide layer and a mixed layer of TiON and TiO$_2$ as dielectric layers on a semiconductor substrate having a predetermined substructure by an atomic layer deposition (ALD) method and thus forming a double layer structure, and simultaneously a high capacitance is guaranteed by using a high dielectric property of a mixed layer of TiON and TiO$_2$.

What is claimed is:

1. A method for forming a cell capacitor for a high-integrated DRAM comprising:

depositing a first dielectric layer on a semiconductor substrate having a predetermined lower structure;
    performing a plasma annealing process;
    performing a second annealing process under a nitrogen atmosphere;
    depositing a second dielectric layer on the first dielectric layer;
    performing a low temperature annealing;
    performing a vacuum furnace annealing; and
    sequentially depositing a titanium nitride layer and a polysilicon layer on the second dielectric layer.

2. The method of claim 1, wherein the first dielectric layer comprises Al$_2$O$_3$.

3. The method of claim 1, wherein the first dielectric layer is deposited on the semiconductor substrate in a chamber containing vapor and that is heated to a temperature ranging from about 200 to about 450° C. a pressure ranging from about 0.1 to about 1 Torr.

4. The method of claim 1, wherein, in the plasma annealing process, N$_2$O plasma is used at a temperature ranging from about 300 to about 400° C.

5. The method of claim 1, wherein the second annealing process is performed under a nitrogen atmosphere for a time period ranging from about 10 to about 30 minutes and at a temperature ranging from about 600 to about 650° C.

6. The method of claim 1, wherein the second dielectric layer is formed by alternately depositing at least one TaON layer and at least one TiO$_2$ layer each with a thickness ranging from about 100 to about 200 Å by a ALD method, so that a deposition ratio of the at least one TaON layer to the at least one TiO$_2$ layer is within the ranges (90~92):(8~10).

7. The method of claim 6, wherein the TaON layer is formed with a thickness ranging from about 0.1 to about 10 Å by injecting alternately Ta(OC$_2$H$_5$)$_5$ gas and NH$_3$ gas.

8. The method of claim 6, wherein, in the forming of the TaON layer, inert gas is injected between the injection of the Ta(OC$_2$H$_5$)$_5$ gas and the injection of the NH$_3$ gas.

9. The method of claim 6, wherein the TiO$_2$ layer is formed with a thickness ranging from about 0.1 to about 5 Å by injecting alternately TiCl$_4$ source gas and H$_2$O gas.

10. The method of claim 6, wherein, in the of forming the TiO$_2$, layer, inert gas is injected between the injection of the TiCl$_4$ gas and the injection of the H$_2$O gas.

11. The method of claim 1, wherein the low temperature annealing is performed at a temperature ranging from about 400 to about 550° C., and the furnace vacuum annealing is performed at a temperature ranging from about 600 to about 850° C. and for a time period ranging from about 5 to about 60 minutes.

12. The method of claim 1, wherein the titanium nitride layer is deposited with a thickness ranging from about 200 to about 500 Å, and the polysilicon layer is deposited with a thickness ranging from about 900 to about 1100 Å.

13. A semiconductor integrated circuit comprising a cell capacitor formed in accordance with the method of claim 1.

14. A DRAM comprising a cell capacitor formed in accordance with the method of claim 1.

* * * * *